(12) United States Patent
Kim et al.

(10) Patent No.: US 10,333,498 B2
(45) Date of Patent: *Jun. 25, 2019

(54) LOW-POWER, SMALL-AREA, HIGH-SPEED MASTER-SLAVE FLIP-FLOP CIRCUITS AND DEVICES INCLUDING SAME

(71) Applicant: SAMSUNG ELECTRONICS CO., LTD., Suwon-si, Gyeonggi-do (KR)

(72) Inventors: Min Su Kim, Hwaseong-Si (KR); Jong Woo Kim, Osan-Si (KR); Ji Kyum Kim, Seongnam-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 9 days.

This patent is subject to a terminal disclaimer.

(21) Appl. No.: 15/586,011

(22) Filed: May 3, 2017

(65) Prior Publication Data
US 2017/0237414 A1 Aug. 17, 2017

Related U.S. Application Data

(63) Continuation of application No. 14/613,414, filed on Feb. 4, 2015, now Pat. No. 9,647,644.

(30) Foreign Application Priority Data

Dec. 8, 2014 (KR) .................. 10-2014-0175135

(51) Int. Cl.
*H03K 3/356* (2006.01)
*H03K 3/012* (2006.01)
(Continued)

(52) U.S. Cl.
CPC ........... *H03K 3/012* (2013.01); *H03K 3/0372* (2013.01); *H03K 3/35625* (2013.01); *H03K 19/0002* (2013.01)

(58) Field of Classification Search
None
See application file for complete search history.

(56) References Cited

U.S. PATENT DOCUMENTS

| | | | |
|---|---|---|---|
| 5,633,606 | A | 5/1997 | Gaudet et al. |
| 5,784,384 | A | 7/1998 | Maeno |

(Continued)

FOREIGN PATENT DOCUMENTS

| KR | 1045800 | 6/2011 |
|---|---|---|

OTHER PUBLICATIONS

Vesterbacka, Mark, "A Static CMOS Master-Slave Flip-Flop Experiment," 2000 IEEE, pp. 870-873.

(Continued)

*Primary Examiner* — Long Nguyen
(74) *Attorney, Agent, or Firm* — Volentine, Whitt & Francos, PLLC

(57) ABSTRACT

An integrated circuit includes a plurality of positive edge-triggered master-slave flip-flop circuits sharing a clock signal. At least one of the positive edge-triggered master-slave flip-flop circuits includes; an input stage that provides a first output signal generated from an input signal in response to the clock signal and an inverted clock signal, a first inverting circuit that generates the inverted clock signal by delaying the clock signal, a transmission gate that receives a second output signal and generates a final output signal, and a second inverting circuit that receives the first output signal and generates the second output signal from the first output signal. The clock signal is applied to an NMOS transistor of the transmission gate and a PMOS transistor of the input stage, and the inverted clock signal is applied to a PMOS transistor of the transmission gate and an NMOS transistor of the input stage.

16 Claims, 15 Drawing Sheets

(51) Int. Cl.
*H03K 3/037* (2006.01)
*H03K 3/3562* (2006.01)
*H03K 19/00* (2006.01)

(56) References Cited

U.S. PATENT DOCUMENTS

| | | | |
|---|---|---|---|
| 6,975,152 B1 | 12/2005 | Lapidus | |
| 7,154,317 B2 | 12/2006 | Flynn et al. | |
| 7,180,348 B2* | 2/2007 | Frederick | G06F 1/3203 |
| | | | 327/199 |
| 7,301,381 B2 | 11/2007 | Rhee et al. | |
| 7,590,900 B2 | 9/2009 | Kim et al. | |
| 7,746,138 B2 | 6/2010 | Sekine et al. | |
| 7,772,889 B2 | 8/2010 | Naffziger | |
| 8,352,815 B2 | 1/2013 | Frederick, Jr. | |
| 8,427,214 B2 | 4/2013 | Pal | |
| 8,493,121 B1 | 7/2013 | Ramaraju | |
| 8,502,561 B2 | 8/2013 | Howard et al. | |
| 9,331,680 B2* | 5/2016 | Gurumurthy | H03K 3/35625 |
| 9,647,644 B2* | 5/2017 | Kim | H03K 3/0372 |
| 2009/0300448 A1* | 12/2009 | Tomita | G01B 31/318541 |
| | | | 714/731 |
| 2010/0259309 A1 | 10/2010 | Biyani | |
| 2014/0208176 A1 | 7/2014 | Parikh et al. | |
| 2014/0306735 A1 | 10/2014 | Rasouli et al. | |
| 2015/0236676 A1* | 8/2015 | Cai | H03K 3/012 |
| | | | 327/212 |

OTHER PUBLICATIONS

Ko, Uming et al., "High Performance, Energy Efficient Master-Slave Flip-Flop Circuits," 1995 IEEE, pp. 16-17.

* cited by examiner

FIG. 1C
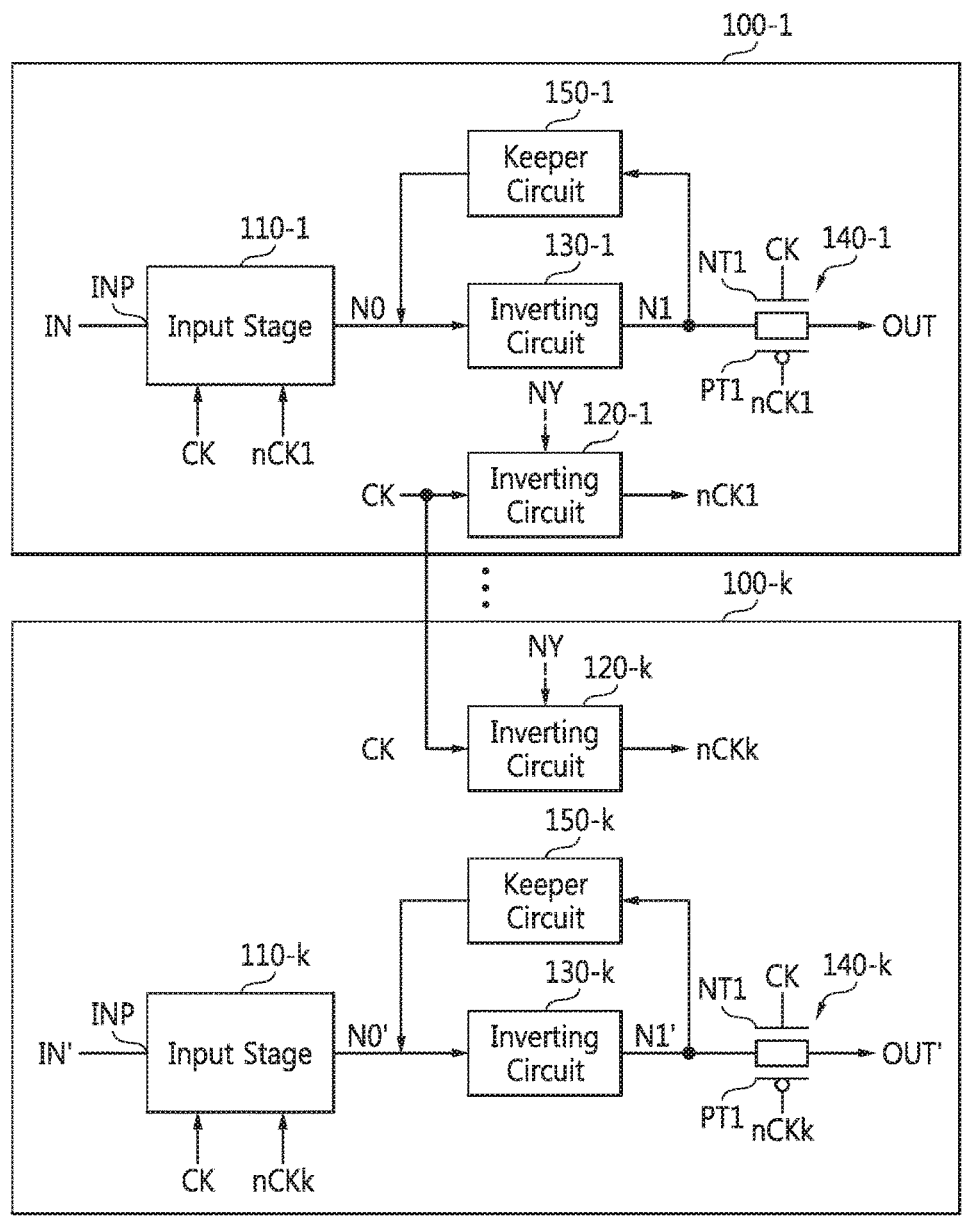
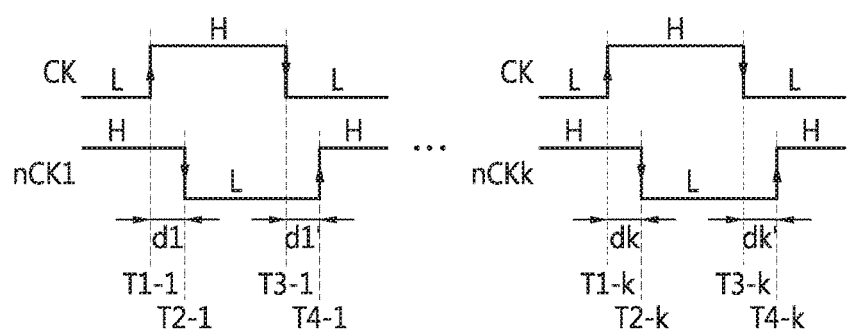

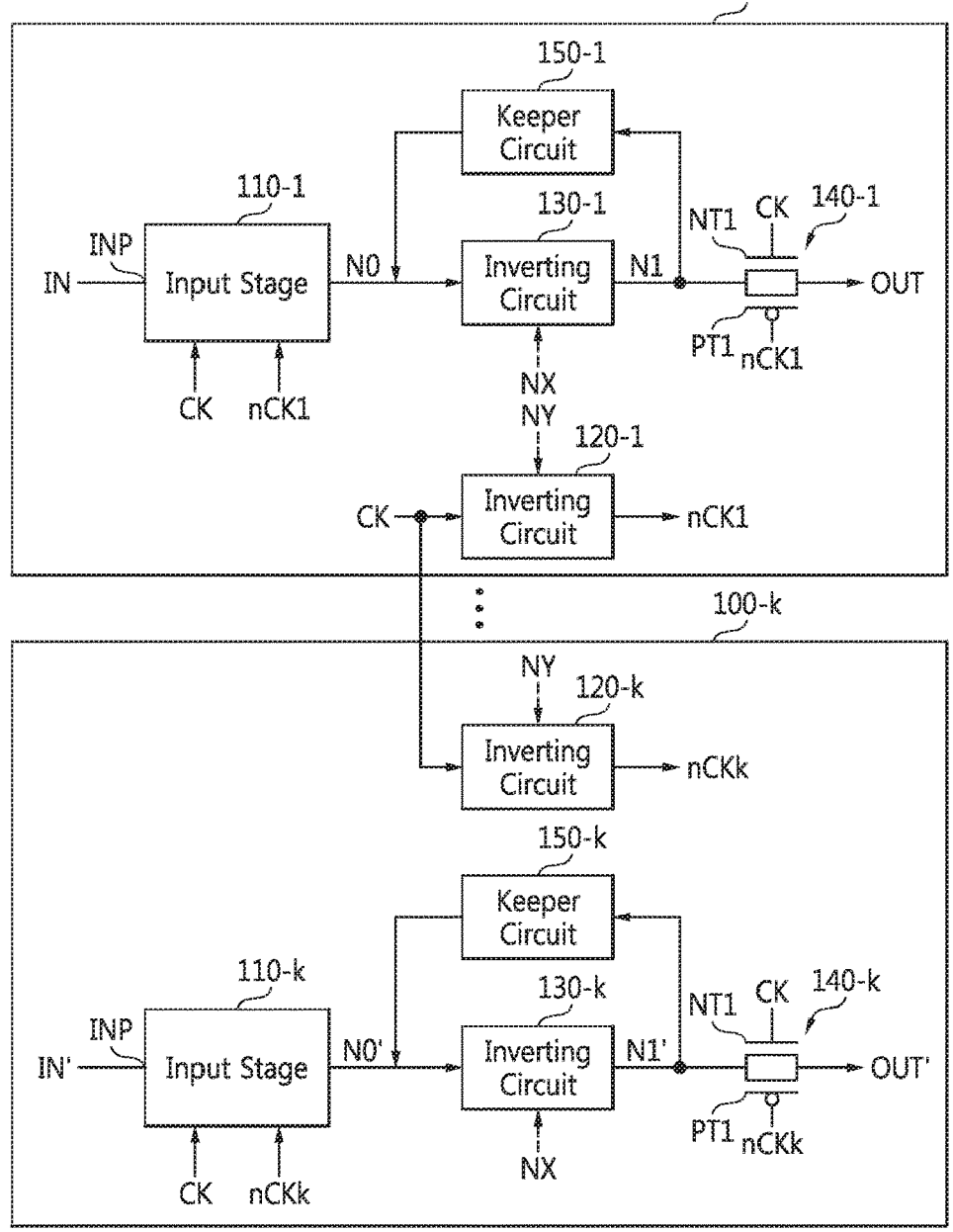
FIG. 1D
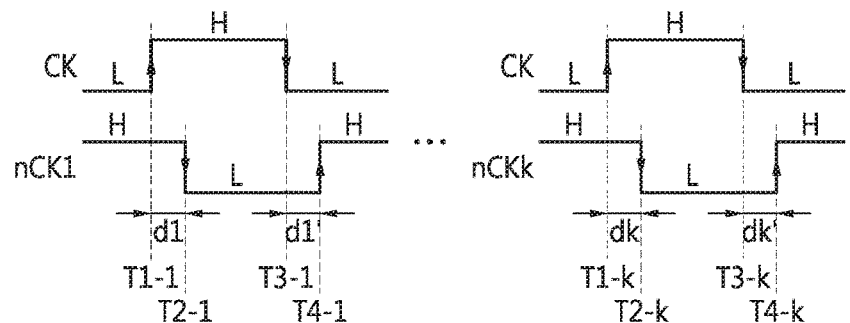

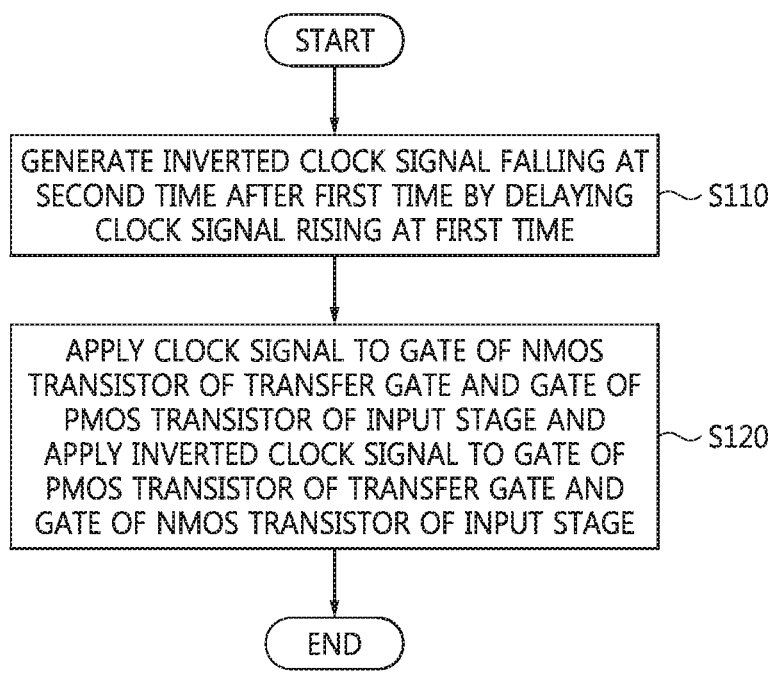

LOW-POWER, SMALL-AREA, HIGH-SPEED MASTER-SLAVE FLIP-FLOP CIRCUITS AND DEVICES INCLUDING SAME

CROSS-REFERENCE TO RELATED APPLICATIONS

This application is a Continuation of U.S. patent application No. 14/613,414, filed Feb. 4, 2015, now U.S. Pat. No. 9,647,644 issued on May 9, 2017, which claims priority under 35 U.S.C. § 119(a) from Korean Patent Application No. 10-2014-0175135 filed on Dec. 8, 2014, the disclosure of which is hereby incorporated by reference.

BACKGROUND

Embodiments of the inventive concept relate generally to positive edge-triggered master-slave flip-flop circuits. More particularly, embodiments of the inventive concept relate to a low-power, small-area, high-speed, positive edge-triggered master-slave flip-flop circuits and devices including the same.

Increased consumer demand for mobile devices such as smart phones and tablet personal computers (PCs) drives ongoing research and development efforts to the design and fabrication of low-power chips. Mobile devices including low-power chips are capable of operating within defined performance parameters over long periods of time by limiting energy consumption (e.g., battery charge). As will be appreciated by those skilled in the art, it is difficult to provide both low power consumption (or extended battery life) and acceptable performance for increasing sophisticated mobile devices.

Many low-power chips include logic circuits configured to process digital signals. Such logic circuits usually include flip-flop circuits and/or latch circuits that are used as data storage elements. That is, flip-flop circuits and latch circuits are able to store, usually in a non-volatile manner, a data state (e.g., a "0" or a "1") for a particular digital signal. Flip-flop circuits and latch circuits are often functionally configured to form certain types of sequential logic circuits. In general distinction, a latch or latch circuit is a level-sensitive data storage element, while a flip-flop or flip-flop circuit is an edge-sensitive data storage element.

Within a constituent mobile device, the power consumed by flip-flop circuits and latch circuits is an important design consideration. Yet, increasing performance demands placed upon contemporary mobile devices requires faster and faster operating speeds for flip-flop circuits and latch circuits which tends to increase overall power consumption. Thus, continuing efforts are being made to reduce the power consumption of flip-flop circuits and latch circuits while still providing acceptable operating speeds.

SUMMARY

Various embodiments of the inventive concept provide a positive edge-triggered master-slave flip-flop circuit capable of operating at high speed and low power while occupying a small area.

According to some embodiments of the inventive concept, there is provided an integrated circuit including a plurality of positive edge-triggered master-slave flip-flop circuits configured to share a clock signal input node receiving a clock signal with each other. One of the positive edge-triggered master-slave flip-flop circuits includes a first inverting circuit implemented with a logic gate which generates an inverted clock signal transiting from a high level to a low level at a second time point later than a first time point by delaying the clock signal transiting from a low level to a high level at the first time point; a transmission gate including a first p-channel metal oxide semiconductor (PMOS) transistor and a first n-channel MOS (NMOS) transistor; an input stage including a second PMOS transistor, a second NMOS transistor, and an input terminal receiving an input signal; and a second inverting circuit connected between an output terminal of the input stage and an input terminal of the transmission gate. The clock signal is applied to a gate of the first NMOS transistor of the transmission gate and to the second PMOS transistor of the input stage and the inverted clock signal is applied to a gate of the first PMOS transistor of the transmission gate and to the second NMOS transistor of the input stage.

The first inverting circuit may include a NAND gate configured to perform a NAND operation on a control signal and the clock signal to output the inverted clock signal and the NAND gate may be implemented with a logic gate. Alternatively, the first inverting circuit may include a NOR gate configured to perform a NOR operation on a control signal and the clock signal to output the inverted clock signal and the NOR gate may be implemented with a logic gate.

The integrated circuit may further include a keeper circuit including an input terminal connected with an output terminal of the second inverting circuit and an output terminal connected with the output terminal of the input stage to latch an output signal of the output terminal of the input stage in response to the clock signal and the inverted clock signal. The keeper circuit may be a tri-state inverter. The integrated circuit may further include a latch circuit including an input terminal connected with an output terminal of the transmission gate and an output terminal connected with the output terminal of the transmission gate to latch an output signal of the output terminal of the transmission gate in response to the clock signal and the inverted clock signal.

The latch circuit may further include an inverter including an input terminal connected with the output terminal of the transmission gate; and a tri-state inverter including an input terminal connected with an output terminal of the inverter and an output terminal connected with the output terminal of the transmission gate to operate in response to the clock signal and the inverted clock signal.

The input stage may be enabled in response to the clock signal and the inverted clock signal before the first time point. The transmission gate may be disabled in response to the clock signal and the inverted clock signal before the first time point. The input stage enabled may transmit to the second inverting circuit an output signal having a phase the same as or opposite to a phase of the input signal received through the input terminal.

The integrated circuit may further include a keeper circuit including an input terminal connected with an output terminal of the second inverting circuit and an output terminal connected with the output terminal of the input stage to latch the output signal in response to the clock signal and the inverted clock signal right after the second time point.

The input stage may be disabled in response to the clock signal and the inverted clock signal right after the second time point. The transmission gate may be enabled in response to the clock signal and the inverted clock signal right after the second time point. The transmission gate enabled may transmit an output signal of the second inverting circuit.

The integrated circuit may further include a latch circuit including an input terminal connected with an output terminal of the transmission gate and an output terminal connected with the output terminal of the transmission gate to latch an output signal of the output terminal of the transmission gate in response to the clock signal and the inverted clock signal right after a fourth time point. The clock signal may transit from the high level to the low level at a third time point later than the second time point and the inverted clock signal may transit from the low level to the high level at the fourth time point later than the third time point.

When the input signal includes a plurality of input bits, the input stage may logically combine the input bits in response to the clock signal and the inverted clock signal, may invert one of the input bits in a logical combination result, and may transmit an inverted signal to the second inverting circuit.

The positive edge-triggered master-slave flip-flop circuits may be implemented to be suitable for a standard cell library.

According to other embodiments of the inventive concept, there is provided a system on chip including function components. At least one of the function components includes a plurality of positive edge-triggered master-slave flip-flop circuits configured to share a clock signal input node receiving a clock signal with each other. One of the positive edge-triggered master-slave flip-flop circuits includes a first inverting circuit implemented with a logic gate which generates an inverted clock signal transiting from a high level to a low level at a second time point later than a first time point by delaying the clock signal transiting from a low level to a high level at the first time point; a transmission gate including a first PMOS transistor and a first NMOS transistor; an input stage including a second PMOS transistor, a second NMOS transistor, and an input terminal receiving an input signal; and a second inverting circuit connected between an output terminal of the input stage and an input terminal of the transmission gate. The clock signal is applied to a gate of the first NMOS transistor of the transmission gate and to the second PMOS transistor of the input stage and the inverted clock signal is applied to a gate of the first PMOS transistor of the transmission gate and to the second NMOS transistor of the input stage.

According to further embodiments of the inventive concept, there is provided a mobile computing device including an application processor including a plurality of function components, a power management integrated circuit configured to provide operating voltages for the application processor, a memory connected with the application processor, and a display controlled by the application processor.

At least one of the function components includes a plurality of positive edge-triggered master-slave flip-flop circuits configured to share a clock signal input node receiving a clock signal with each other. One of the positive edge-triggered master-slave flip-flop circuits includes a first inverting circuit implemented with a logic gate which generates an inverted clock signal transiting from a high level to a low level at a second time point later than a first time point by delaying the clock signal transiting from a low level to a high level at the first time point; a transmission gate including a first PMOS transistor and a first NMOS transistor; an input stage including a second PMOS transistor, a second NMOS transistor, and an input terminal receiving an input signal; and a second inverting circuit connected between an output terminal of the input stage and an input terminal of the transmission gate. The clock signal is applied to a gate of the first NMOS transistor of the transmission gate and to the second PMOS transistor of the input stage and the inverted clock signal is applied to a gate of the first PMOS transistor of the transmission gate and to the second NMOS transistor of the input stage.

The at least one of the function components may be a central processing unit (CPU), a graphics processing unit (GPU), a core of a multi-core processor, a digital signal processor (DSP), an image signal processor (ISP), a hardware codec, a multimedia processor, or a memory interface.

BRIEF DESCRIPTION OF THE DRAWINGS

The above and other features and advantages of the inventive concept will become more apparent upon consideration of certain exemplary embodiments thereof with reference to the attached drawings in which:

FIGS. 1A, 1B, 1C and 1D (hereafter, collectively "FIGS. 1A through 1D") are block diagrams illustrating respective integrated circuits including positive edge-triggered, master-slave flip-flop circuits according to certain embodiments of the inventive concept;

FIG. 16 is a general flowchart summarizing a method of operating a positive edge-triggered master-slave flip-flop circuits according to certain embodiments of the inventive concept.

DETAILED DESCRIPTION

Figure 1A:
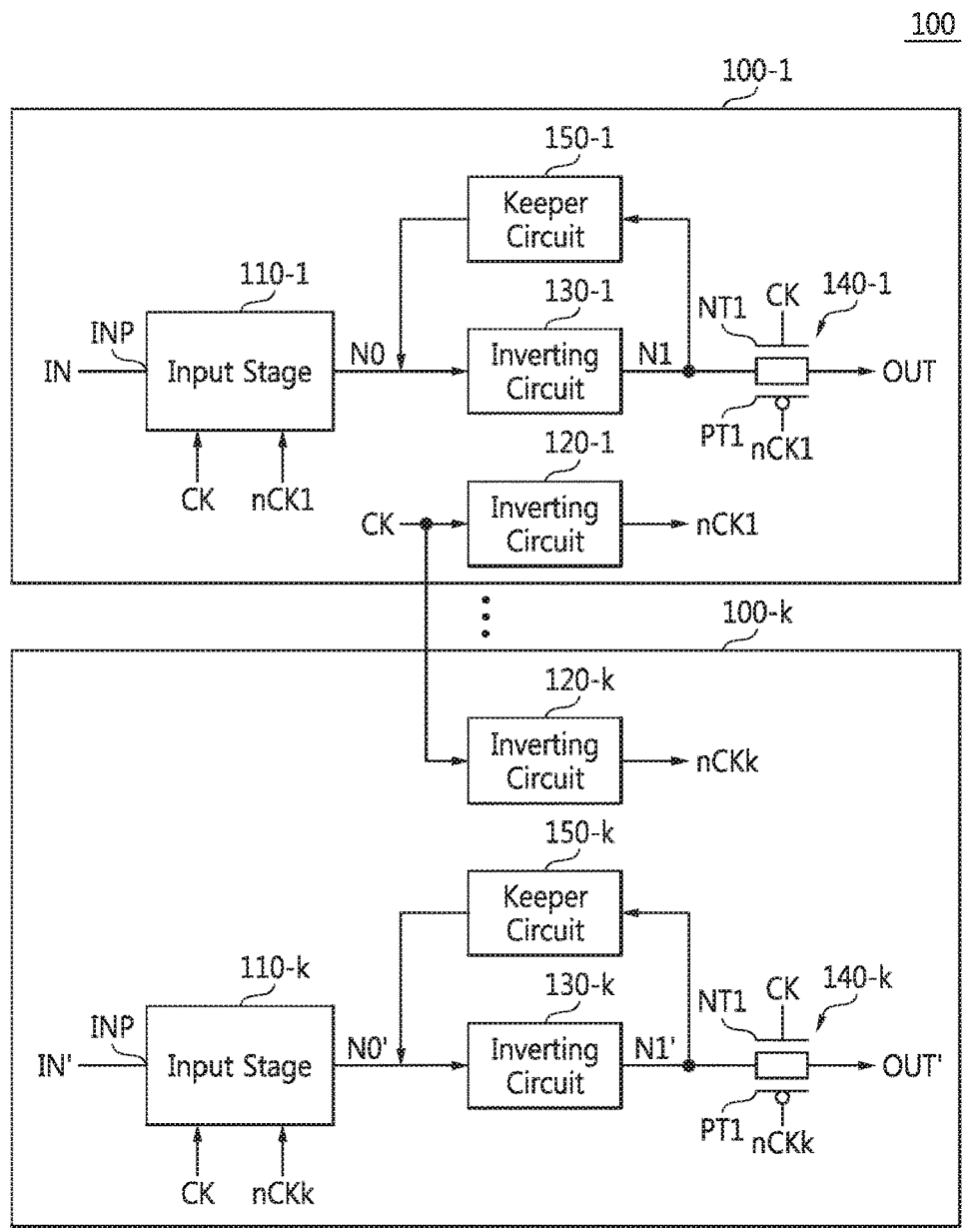

Embodiments of the inventive concept will now be described in some additional detail with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the invention to those skilled in the art.

Throughout the written description and drawings, like reference numbers and labels are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIGS. 1A through 1D are block diagrams illustrating respective integrated circuits 100 including positive edge-triggered master-slave flip-flop circuits 100-1 through 100-$k$ according to certain embodiments of the inventive concept. Referring to FIGS. 1A through 1D, the positive edge-triggered master-slave flip-flop circuits (hereinafter, referred to as "flip-flop circuits") 100-1 through 100-$k$, where "k" is a natural number greater than 1, are assumed to share a clock signal CK apparent at one or more clock signal input node(s). The one or more clock signal input node(s) may be a pin, pad, metal line or similar conductive element or circuit section.

Referring to FIG. 1A, the first flip-flop circuit 100-1 may include an input stage 110-1, a first inverting circuit 120-1, a second inverting circuit 130-1, and a transmission gate 140-1. In some embodiments of the inventive concept, the first flip-flop circuit 100-1 may also include a keeper circuit 150-1. The k-th flip-flop circuit 100-$k$ may include an input stage 110-$k$, a first inverting circuit 120-$k$, a second inverting circuit 130-$k$, and a transmission gate 140-$k$. According to some embodiments of the inventive concept, the k-th flip-flop circuit 100-$k$ may also include a keeper circuit 150-$k$.

Apart from the first input signals IN and IN' and first output signals N0 and N0' for the respective input stages 110-1 and 110-$k$, the structure and operation of the respective input stages may be substantially similar to those described herein with respect to the input stage 110-$k$. Apart from output clock signals nCK1 and nCKk for the respective first inverting circuits 120-1 and 120-$k$, the structure and operation of the respective inverting circuits may be substantially similar to those described herein with respect to the first inverting circuit 120-$k$. Apart from the first output signals N0 and N0' from the first input stages received as second input signals to the respective second inverting circuits 130-1 and 130-$k$ and second output signals N1 and N1', the structure and operation of the respective second inverting circuits may be substantially similar to those described herein with respect to the second inverting circuit 130-$k$. Apart from the second output signals N1 and N1' from the second inverting circuits 130-1 and 130-$k$ received as third input signals to the respective transmission gates 140-1 and 140-$k$ and final output signals OUT and OUT', the structure and operation of the respective transmission gates may be substantially similar to those described herein with respect to the transmission gate 140-$k$.

Various examples of the input stages 110-1 and 110-$k$ will be described with reference to FIGS. 2, 3A, 3B, 4A and 4B. Various examples of the first inverting circuits 120-1 and 120-$k$ will be described with reference to FIGS. 5, 6 and 7. Various examples of the second inverting circuits 130-1 and 130-$k$ will be described with reference to FIGS. 8, 9 and 10.

In the first flip-flop circuit 100-1, the first inverting circuit 120-1 may be used to delay the clock signal CK that rises from a low level L (or "low") to a high level H (or "high") at a first time T1-1. In part, the applied delay period "d1" generates a first inverted clock signal nCK1 that falls from high to low at a second time T2-1 following first time T1-1. The first inverted clock signal nCK1 is a clock signal used only within the first flip-flop circuit 100-1.

Herein, the terms "rising" or "rise" verses "falling" or "fall" are used to generally indicate opposing signal level transitions, where the term "rising edge" (or "positive edge") is used to indicate a signal transition from low to high and the term "falling edge" (or "negative edge") is used to indicate a signal transition from high to low. When a circuit is said to be "rising edge-triggered", it becomes active when an applied clock signal transitions from low to high. Thus, a rising edge-triggered circuit ignores high-to-low clock signal transitions. Analogously, when a circuit is said to be "falling edge-triggered", it becomes active when an applied clock signal transitions from high to low, but will generally ignores low-to-high clock signal transitions.

The flip-flop circuits 100-1 through 100-k described herein are rising edge-triggered flip-flop circuits, and more particularly, rising edge-triggered master-slave flip-flop circuits.

As previously noted, the first inverting circuit 120-1 may be used to delay the applied clock signal CK that transitions from high to low at a third time T3-1 following the second time T2-1 by a delay time "d1'" in order to generate the first inverted clock signal nCK1 that transitions from low to high at a fourth time T4-1 following the third time T3-1. The first inverted clock signal nCK1 may be used only within the first flip-flop circuit 100-1. The delay time "d1'" between the third and fourth times T3-1 and T4-1 may be the same as, or different from the delay time "d1" between the first and second times T1-1 and T2-1 depending on the physical properties of the first inverting circuit 120-1.

In the k-th flip-flop circuit 100-$k$, the first inverting circuit 120-$k$ also receives the clock signal CK from the one or more clock signal input node(s), and inverts the clock signal CK to generate a kth inverted clock signal nCKk. In the k-th flip-flop circuit 100-$k$, the first inverting circuit 120-$k$ may be used to delay the clock signal CK that rises from a low level L (or "low") to a high level H (or "high") at a first time T1-$k$. In part, the applied delay period "dk" generates a kth inverted clock signal nCKk that falls from high to low at a second time T2-$k$ following first time T1-$k$. The kth inverted clock signal nCKk is a clock signal used only within the k-th flip-flop circuit 100-$k$. In the k-th flip-flop circuit 100-$k$, the first inverting circuit 120-$k$ may be used to delay the applied clock signal CK that transitions from high to low at a third time T3-$k$ following the second time T2-$k$ by a delay time "dk'" in order to generate the kth inverted clock signal nCKk that transitions from low to high at a fourth time T4-$k$ following the third time T3-$k$. Here, the kth inverted clock signal nCKk may be used only within the k-th flip-flop circuit 100-$k$. The delay times "d1" through "dk" respectively applied by the first inverting circuits 120-1 through 120-$k$ may be the same or different depending on the physical properties of the first inverting circuits 120-1 through 120-$k$. The delay times "d1'" through "dk'" respectively applied by the first inverting circuits 120-1 through 120-$k$ may be the same or different depending on the physical properties of the first inverting circuits 120-1 through 120-$k$. Of further note, the duration of the applied delay times "d1" through "dk" and "d1'" through "dk'" illustrated in FIGS. 1A through 1D are very short relative to the duration of the respective clock signals, and have been enlarged in the drawings for clarity of illustration. For example, each time T1-1 through T1-$k$ may be the same or different, each time T2-1 through T2-$k$ may be the same or different, each time T3-1 through T3-$k$ may be the same or different, and each time T4-1 through T4-$k$ may be the same or different.

In the illustrated embodiments of FIGS. 1A through 1D, the level or phase transition(s) of the first through kth inverted clock signals nCK1 through nCKk generated by the respective first inverting circuits 120-1 through 120-$k$ lag the clock signal CK.

Figure 1B:
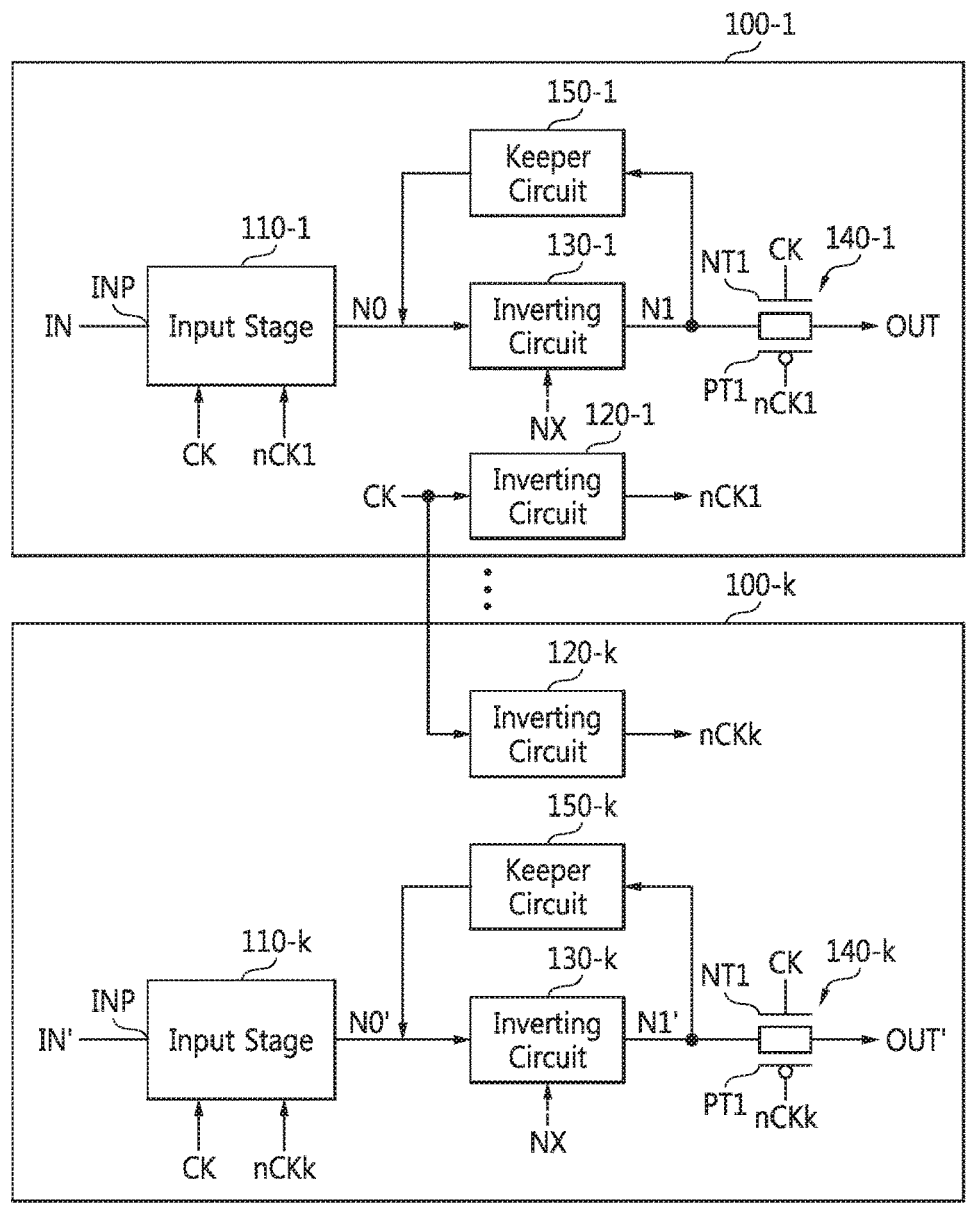
Figure 5:
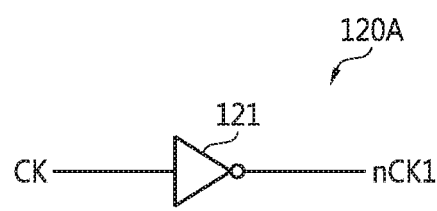
FIG. 5 is a diagram illustrating one example of a first inverting circuit that may be used in the integrated circuits of FIGS. 1A and 1B.

FIG. 5 is a diagram further illustrating in one example 120A the first inverting circuit 120-1 of FIGS. 1A and/or 1B. Referring to FIGS. 1A, 1B, and 5, the first inverting circuit 120A may include an inverter 121 that inverts the clock signal CK received via an input clock signal node and generates the first inverted clock signal nCK1. The inverter 121 may be implemented as a single logic gate. In other words, each of the first inverting circuits 120-1 through 120-$k$ may be implemented as a respective single inverter 121.

Figure 6:
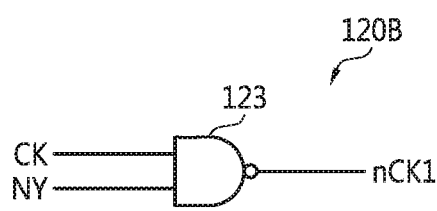
FIGS. 6 and 7 are respective diagrams respectively illustrating different examples of a first inverting circuit that may be used in the integrated circuits of FIGS. 1C and 1D.

FIG. 6 is a diagram further illustrating in another example 120B the first inverting circuit 120-1 of FIGS. 1C and/or 1D. Referring to FIGS. 1C, 1D, and 6, the first inverting circuit 120B may be implemented using a NAND gate 123 that performs a NAND operation on a control signal NY and the clock signal CK to generate the first inverted clock signal nCK1. The NAND gate 123 may be implemented using a single logic gate. In other words, each of the first inverting circuits 120-1 through 120-$k$ may be implemented as a respective single NAND gate 123. Thus, when the control signal NY is held at a high level (hereafter, "high"), the NAND gate 123 will function as an inverter, and when the control signal NY is held at a low level (hereafter "low"), the NAND gate 123 will output a continuously high, first inverted clock signal nCK1 regardless of the level of the clock signal CK.

Figure 7:
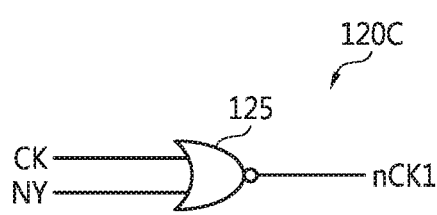

FIG. 7 is a diagram further illustrating in yet another example 120C the first inverting circuit 120-1 of FIGS. 1C and/or 1D. Referring to FIGS. 1C, 1D, and 7, the first inverting circuit 120C may be implemented using a NOR gate 125 that performs a NOR operation on the control signal NY and the clock signal CK to generate the first inverted clock signal nCK1. The NOR gate 125 may be implemented using a single logic gate. In other words, each of the first inverting circuits 120-1 through 120-$k$ may be implemented using a single respective NOR gate 125. Thus, when the control signal NY is held low, the NOR gate 125 will function as an inverter, and when the control signal NY is held high, the NOR gate 125 will output a continuously low, first inverted clock signal nCK1 regardless of the level of the clock signal CK.

Thus, as illustrated by the foregoing embodiments, the NAND gate 123 or the NOR gate 125 may be used to gate (or mask) the clock signal CK using the level of the control signal NY. Further, according to the illustrated embodiments of the inventive concept, there are considerable advantages (e.g., operating speed and circuit size) to implementing each of the first inverting circuits 120-1 through 120-$k$ using only a single logic gate to delay the clock signal CK.

Referring again to FIGS. 1A through 1D, each of the input stages 110-1 and 110-$k$ may include a p-channel metal oxide semiconductor (PMOS) transistor, an n-channel MOS (NMOS) transistor, and an input terminal INP that receives a respective input signal IN or IN'. Here again, the input terminal INP may be a node, a pin, a pad, or a metal line.

Figure 2:
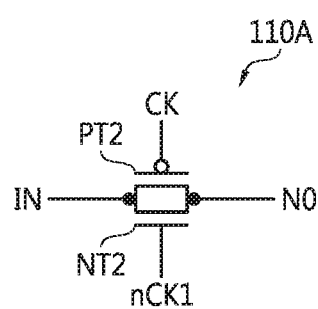
FIG. 2 is a circuit diagram illustrating in one example an input stage that may be used in the integrated circuits of FIGS. 1A through 1D.

FIG. 2 is a diagram further illustrating in one example 110A the input stage 110-1 of FIGS. 1A through 1D. Referring to FIGS. 1A through 2, the input stage 110A may be implemented as a transmission gate including a PMOS transistor PT2 and a NMOS transistor NT2, where the applied first input signal IN includes at least one data bit. The clock signal CK is applied to the gate of the PMOS transistor PT2 and the inverted clock signal nCK1 is applied to the gate of the NMOS transistor NT2. Accordingly, the transmission gate 110A may provide a first output signal N0 having the same phase as the first input signal IN in response to the clock signal CK and the inverted clock signal nCK1. Each of the input stages 110-1 through 110-$k$ may be implemented using a similar transmission gate configuration.

Figure 3A:
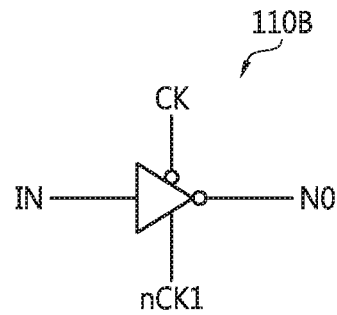
FIGS. 3A, 3B, 4A and 4B are respective circuit diagrams illustrating in other possible examples an input stage that may be used in the integrated circuits of FIGS. 1A through 1D.
Figure 3B:
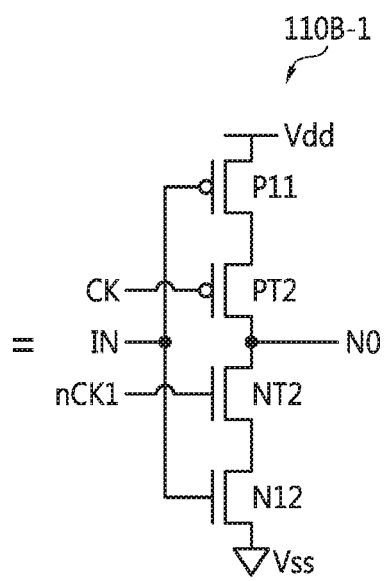

FIGS. 3A and 3B are diagrams further and respectively illustrating other examples of the input stage 110-1 that may be used in the integrated circuits of FIGS. 1A through 1D. Referring to FIGS. 1A through 1D and FIG. 3B, the input stage 110B-1 may be implemented using a tri-state inverter that includes the PMOS transistor PT2 and NMOS transistor NT2. The clock signal CK is applied to the gate of the PMOS transistor PT2 and the inverted clock signal nCK1 is applied to the gate of the NMOS transistor NT2. A symbol indicating a tri-state inverter 110B is shown in FIG. 3A, and a corresponding circuit diagram for the tri-state inverter 110B is shown in FIG. 3B. Each of the input stages 110-1 through 110-$k$ may be implemented using a tri-state inverter.

As shown in FIG. 3B, the first input signal IN to the input stage 110B or 110B-1 is applied to the gate of a PMOS transistor P11 and a gate of an NMOS transistor N12. The MOS transistors P11, PT2, NT2, and N12 are connected in series between a first node (or a voltage line) providing an operating voltage Vdd and a second node (or a ground line) connected to a ground voltage Vss. An output terminal of the input stage 110B or 110B-1 is connected to a common node between the PMOS transistor PT2 and the NMOS transistor NT2.

Figure 4A:
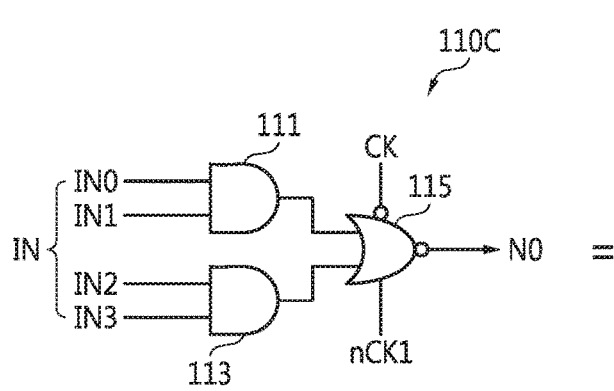
Figure 4B:
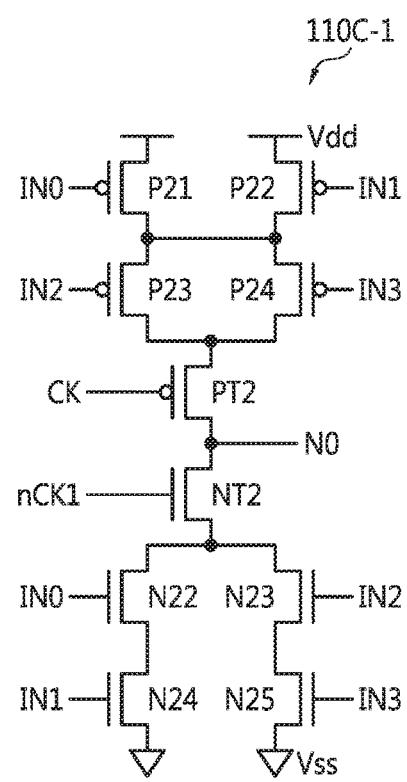

FIGS. 4A and 4B are diagrams further and respectively illustrating still other examples 110C of the input stage 110-1 that may be used in the integrated circuits of FIGS. 1A through 1D. Referring to FIGS. 1A through 1D and FIG. 4A, the input stage 110C includes logic gates 111 and 113 and a tri-state inverter 115. Reference numeral 110C-1 shown in FIG. 4B denotes a circuit diagram of the tri-state inverter 110C including the logic circuits 111 and 113 shown in FIG. 4A.

When the input signal IN of the input stage 110-1 or 110C includes a plurality of input bits IN0 through IN3, the first AND gate 111 performs an AND operation on the input bits IN0 and IN1 and the second AND gate 113 performs an AND operation on the input bits IN2 and IN3. The tri-state inverter 115 may process a signal or more related with output signals of the AND gates 111 and 113 in response to the clock signal CK and the inverted clock signal nCK1.

As shown in FIG. 4B, the input stage 110C-1 includes the PMOS transistor PT2 having a gate that receives the clock signal CK and the NMOS transistor NT2 having a gate that receives the inverted clock signal nCK1. The first input bit IN0 is applied to gates of transistors P21 and N22. The second input bit IN1 is applied to gates of transistors P22 and N24. The third input bit IN2 is applied to gates of transistors P23 and N23. The fourth input bit IN3 is applied to gates of transistors P24 and N25. Each of the input stages 110-1 through 110-k may be implemented with the logic gates 111 and 113 and the tri-state inverter 115.

Returning to FIGS. 1A through 1D, the second inverting circuit 130-1 is connected between an output terminal of the input stage 110-1 and an input terminal of the transmission gate 140-1, and the second inverting circuit 130-k is connected between an output terminal of the input stage 110-k and an input terminal of the transmission gate 140-k. Thus, the second inverting circuits 130-1 and 130-k receive and invert the first output signals N0 and N0' respectively provided by the corresponding input stages 110-1 and 110-k.

Figure 8:
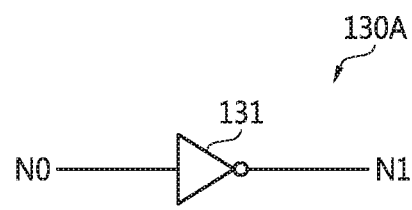
FIG. 8 is a diagram illustrating one example of a second inverting circuit that may be used in the integrated circuits of FIGS. 1A and 1C.

FIG. 8 is a diagram illustrating in one example 130A the second inverting circuit 130-1 of FIG. 1A and/or 1C. Referring to FIGS. 1A, 1C, and 8, the second inverting circuit 130A may be implemented using an inverter 131 that receives the first output signal (second input signal) N0 provided by the input stage 110-1 and inverts the first output signal N0 to generate the second output signal N1. Each of the second inverting circuits 130-1 through 130-k may be implemented using a single inverter 131.

Figure 9:
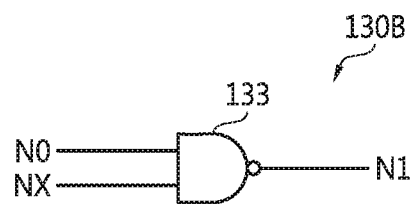
FIGS. 9 and 10 are diagrams respectively illustrating different examples of a second inverting circuit that may be used in the integrated circuits of FIGS. 1B and 1D.

FIG. 9 is a diagram illustrating in another example 130B the second inverting circuit 130-1 of FIGS. 1B and/or 1D. Referring to FIGS. 1B, 1D, and 9, the second inverting circuit 130B may be implemented using a NAND gate 133 that performs a NAND operation on a control signal NX and the first output signal (second input signal) N0 provided by the input stage 110-1 in order to generate the second output signal N1. For example, when the control signal NX is held high, the NAND gate 133 will function as an inverter, but when the control signal NX is held low, the NAND gate 133 will output a continuously high second output signal regardless of the level of the first output signal N0 provided by the input stage 110-1. Each of the second inverting circuits 130-1 through 130-k may be implemented using a single NAND gate 133.

Figure 10:
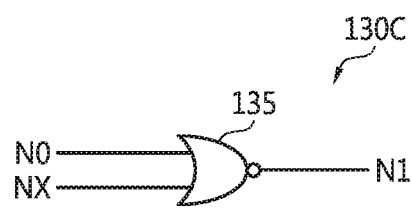

FIG. 10 is a diagram illustrating in still another example 130C the second inverting circuit 130-1 of FIGS. 1B and/or 1D. Referring to FIGS. 1B, 1D, and 10, the second inverting circuit 130C may be implemented using a NOR gate 135 that performs a NOR operation on the control signal NX and the first output signal (second input signal) N0 provided by the input stage 110-1 in order to generate the second output signal N1. Each of the second inverting circuits 130-1 through 130-k may be implemented using a single NOR gate 135. For example, when the control signal NX is held low, the NOR gate 135 will function as an inverter, but when the control signal NX is held high level, the NOR gate 135 will provide a continuously low second output signal N1 regardless of the level of the first output signal N0 provided by the input stage 110-1.

In this manner, the control signal NX applied to the NAND gate 133 or the NOR gate 135 may be used to reset or set the first flip-flop circuits 100-1 through 100-k. Further, each of the second inverting circuits 130-1 and 130-k may be implemented using only a single logic gate to delay the first output signal N0 or N0' received from the input stage 110-1 or 110-k.

Returning to FIGS. 1A through 1D, each of the transmission gates 140-1 and 140-k may include a PMOS transistor PT1 and a NMOS transistor NT1, where the channel width of the PMOS transistor PT1 may be substantially the same as that of the NMOS transistor NT1 taking into account a defined error range in view of expected process, voltage and temperature (PVT) variations.

The clock signal CK input may be applied to the gate of NMOS transistor NT1 in the transmission gate 140-1 as well as the PMOS transistor PT2 in the input stage 110-1. The inverted clock signal nCK1 generated by the first inverting circuit 120-1 may be applied to the gate of the PMOS transistor PT1 of the transmission gate 140-1 as well as the NMOS transistor NT2 of the input stage 110-1. The clock signal CK apparent at the clock signal input node may also be applied to the gate of the NMOS transistor NT1 of the transmission gate 140-k and the PMOS transistor PT2 of the input stage 110-k. The inverted clock signal nCKk generated by the first inverting circuit 120-k is applied to the gate of the PMOS transistor PT1 of the transmission gate 140-k and the NMOS transistor NT2 of the input stage 110-k.

Figure 11:
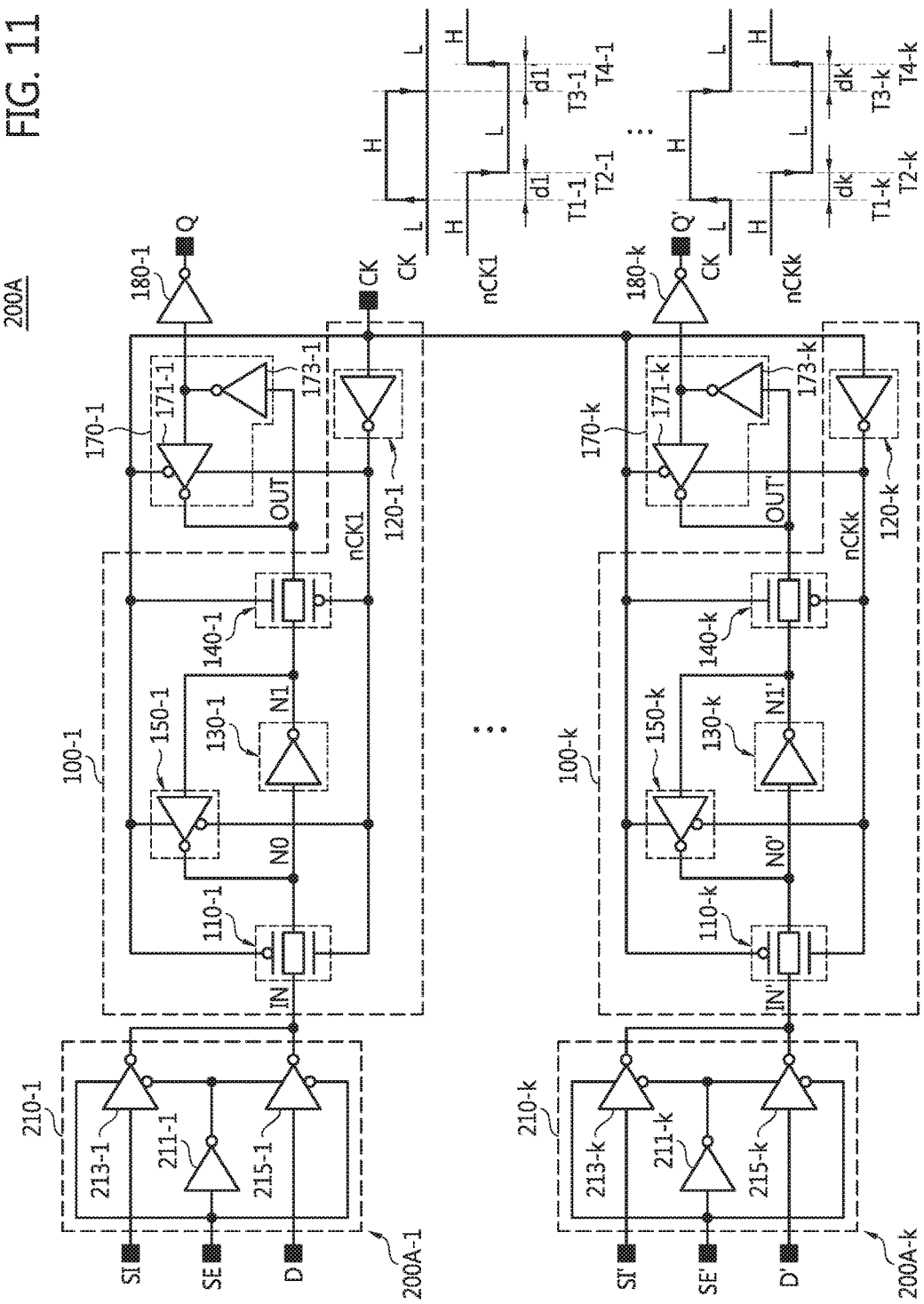
FIGS. 11, 12 and 13 are respective circuit diagrams illustrating in relevant part various integrated circuits including positive edge-triggered master-slave flip-flop circuits including a selection circuit according to certain embodiments of the inventive concept.

FIG. 11 is a circuit diagram illustrating an integrated circuit 200A including positive edge-triggered, master-slave flip-flop circuits including a selection circuit according to certain embodiments of the inventive concept. Referring to FIG. 11 in the context of the foregoing embodiments, the integrated circuit 200A includes a plurality of flip-flops 100-1 through 100-k sharing a clock signal CK apparent at a clock signal input node.

A first flip-flop circuit 200A-1 includes a selection circuit 210-1, an input stage 110-1, a first inverting circuit 120-1, a second inverting circuit 130-1, a transmission gate 140-1, a keeper circuit 150-1, and a latch circuit 170-1.

An input terminal of the keeper circuit 150-1 is connected with an output terminal of the second inverting circuit 130-1. An output terminal of the keeper circuit 150-1 is connected with an output terminal of the input stage 110-1. The keeper circuit 150-1 may be implemented using a tri-state inverter operating in response to the clock signal CK and the inverted clock signal nCK1.

An input terminal of the latch circuit 170-1 is connected with an output terminal of the transmission gate 140-1. An output terminal of the latch circuit 170-1 is connected with the output terminal of the transmission gate 140-1. The latch circuit 170-1 may latch the output signal OUT of the transmission gate 140-1 in response to the clock signal CK and the inverted clock signal nCK1.

The latch circuit 170-1 may include a tri-state inverter 171-1 and an inverter 173-1. An input terminal of the inverter 173-1 is connected with the output terminal of the transmission gate 140-1. An input terminal of the tri-state inverter 171-1 is connected with an output terminal of the inverter 173-1 and an output terminal of the tri-state inverter 171-1 is connected with the output terminal of the transmission gate 140-1.

Although the input stage 110-1, as illustrated in FIG. 11, is implemented using a transmission gate, and the first and second inverting circuits 120-1 and 130-1 are implemented using respective inverters, other embodiments of the inventive concept are not restricted to only these implementation choices. For example, the input stage 110-1 may be implemented as the transmission gate 110A, the tri-state inverter 110B, or the tri-state inverter 110C including the logic circuits 111 and 113 as in the embodiments illustrated in FIG. 2, 3, or 4. The second inverting circuit 130-1 may be implemented with the inverter 131, the NAND gate 133, or the NOR gate 135 when the first inverting circuit 120-1 is implemented with the inverter 121 in certain embodiments of the inventive concept. The second inverting circuit 130-1 may be implemented with the inverter 131, the NAND gate 133, or the NOR gate 135 when the first inverting circuit 120-1 is implemented with the NAND gate 123 in other embodiments of the inventive concept. The second inverting circuit 130-1 may be implemented with the inverter 131, the NAND gate 133, or the NOR gate 135 when the first inverting circuit 120-1 is implemented with the NOR gate 125 in further embodiments of the inventive concept.

The selection circuit 210-1 may provide either a scan input signal SI or a data input signal D to the input stage 110-1 as the input signal IN in response to a scan enable signal SE. The selection circuit 210-1 may include an inverter 211-1, a first tri-state inverter 213-1, and a second tri-state inverter 215-1. When the scan enable signal SE is high, the first tri-state inverter 213-1 is enabled to provide the scan input signal SI to the input stage 110-1 as the input signal IN. When the scan enable signal SE is low, the second tri-state inverter 215-1 is enabled to provide the data input signal D to the input stage 110-1 as the input signal IN.

The input stage 110-1 may be enabled (or activated) in response to a low clock signal CK and a high inverted clock signal nCK1 before the first time T1-1. The activated input stage 110-1 may provide the first output signal N0 having the same or opposite phase as the first input signal IN received via the input terminal INP to the second inverting circuit 130-1 as a second input signal. For example, assuming that the input stage 110-1 is implemented using the transmission gate 110A of FIG. 2, the input stage 110-1 will provide the first output signal N0 having the same phase as the first input signal IN to the second inverting circuit 130-1 in response to a low clock signal CK and a high inverted clock signal nCK1. However, when the input stage 110-1 is implemented using the tri-state inverter 110B as illustrated in FIG. 3, or the tri-state inverter 110C including the logic gates 111 and 113 as illustrated in FIG. 4A, the input stage 110-1 will provide the first output signal N0 having the opposite phase to that of the first input signal IN to the second inverting circuit 130-1 in response to a low clock signal CK and a high inverted clock signal nCK1.

Before the first time T1-1, the transmission gate 140-1 is disabled (or inactivated) in response to the low clock signal CK and the high inverted clock signal nCK1, the latch circuit 170-1 may latch the final output signal OUT of the transmission gate 140-1 in response to low clock signal CK and the high inverted clock signal nCK1, and the keeper circuit (e.g., tri-state inverter 150-1) is disabled (or inactivated).

At the first time T1-1, the clock signal CK transitions from low to high, and at the second time T2-1 following the first time T1-1, the inverted clock signal nCK1 transitions from high to low.

When it is assumed that the delay time "d1" is very short, the transition (or rising) of the clock signal CK and the transition (or falling) of the inverted clock signal nCK1 occur almost simultaneously. Under these conditions, it may be said that the first time T1-1 and the second time T2-1 are "substantially the same".

Right after the second time T2-1 (or at the first and second times T1-1, T2-1 when the delay time "d1" is very short such that the first and second times may be considered substantially the same), the input stage 110-1 is disabled in response to the high clock signal CK and low inverted clock signal nCK1.

Right after the second time point T2-1, the tri-state inverter 150-1 latches the first output signal N0 provided by the input stage 110-1 in response to the high clock signal CK and the low inverted clock signal nCK1, the transmission gate 140-1 is enabled in response to the high clock signal CK and low inverted clock signal nCK1, such that the second output signal N1 is provide by the second inverting circuit 130-1.

For example, it is assumed that a master (or a master latch) includes the input stage 110-1, second inverting circuit 130-1, and keeper circuit 150-1, and that a slave (or a slave latch) includes the transmission gate 140-1 and latch circuit 170-1.

Right after the second time T2-1, the master latches an input signal (or an inverted input signal), and the latch circuit 170-1 is disabled in response to the high clock signal CK and low inverted clock signal nCK1.

At the third time T3-1 following the second time T2-1, the clock signal CK transitions from high to low, and at the fourth time T4-1 following the third time T3-1, the inverted clock signal nCK1 transitions from low to high. In other words, the clock signal CK may be said to have a fixed period in certain embodiments.

When it is assumed that a time period between the third and fourth times is very short, the falling transition of the clock signal CK and the rising transition of the inverted clock signal nCK1 may be said to occur almost simultaneously. Thus, under these conditions the third time T3-1 and fourth time T4-1 may be said to be substantially the same.

Right after the fourth time T4-1 (or at the third or fourth times when the delay time "d1'" is very short such that the third and fourth times may be said to be substantially the same), the input stage 110-1 is enabled in response to the low clock signal CK and high inverted clock signal nCK1. Accordingly, the input stage 110-1 is enabled and provides the first input signal IN to the second inverting circuit 130-1 as the first output signal N0 and the second inverting circuit 130-1 receives and inverts the first output signal N0 and outputs the second output signal N1.

Right after the fourth time T4-1, the tri-state inverter 150-1 is disabled in response to the low clock signal CK and the high inverted clock signal nCK1, and the transmission gate 140-1 is disabled in response to the low clock signal CK and high inverted clock signal nCK1. Accordingly, provision of the second output signal N1 by the second inverting circuit 130-1 is cut off when the transmission gate 140-1 disabled. Thus, right after the fourth time T4-1, the latch circuit 170-1 latches the final output signal OUT provided by the transmission gate 140-1 in response to low clock signal CK and the high inverted clock signal nCK1.

An inverter 180-1 may output the final output signal Q having the same phase as the data input signal D with reference to the phase of the data input signal D.

In FIG. 11, a k-th flip-flop circuit 200A-k includes a selection circuit 210-k, an input stage 110-k, a first inverting circuit 120-k, a second inverting circuit 130-k, a transmission gate 140-k, a keeper circuit 150-k, and a latch circuit 170-k. The first inverting circuit 120-k may be used to generate the inverted clock signal nCKk in response to the clock signal CK.

An input terminal of the keeper circuit 150-k is connected with an output terminal of the second inverting circuit 130-k. An output terminal of the keeper circuit 150-k is connected with an output terminal of the input stage 110-k. The keeper circuit 150-k may be implemented with a tri-state inverter operating in response to the clock signal CK and the inverted clock signal nCKk.

An input terminal of the latch circuit 170-k is connected with an output terminal of the transmission gate 140-k. An output terminal of the latch circuit 170-k is connected with the output terminal of the transmission gate 140-k. The latch circuit 170-k may latch the output signal OUT of the transmission gate 140-k in response to the clock signal CK and the inverted clock signal nCKk.

The latch circuit 170-k may include a tri-state inverter 171-k and an inverter 173-k. An input terminal of the inverter 173-k is connected with the output terminal of the transmission gate 140-k. An input terminal of the tri-state inverter 171-k is connected with an output terminal of the inverter 173-k and an output terminal of the tri-state inverter 171-k is connected with the output terminal of the transmission gate 140-k.

The selection circuit 210-k may provide either a scan input signal SI' or a data input signal D' to the input stage 110-k as the kth input signal IN' in response to a scan enable signal SE'. The selection circuit 210-k may include an inverter 211-k, a first tri-state inverter 213-k, and a second tri-state inverter 215-k.

When the scan enable signal SE' is high, the first tri-state inverter 213-k may be enabled to provide the scan input signal SI' to the input stage 110-k as the kth input signal IN'. When the scan enable signal SE' is low, the second tri-state inverter 215-k may be enabled to provide the data input signal D' to the input stage 110-k as the kth input signal IN'.

Figure 12:
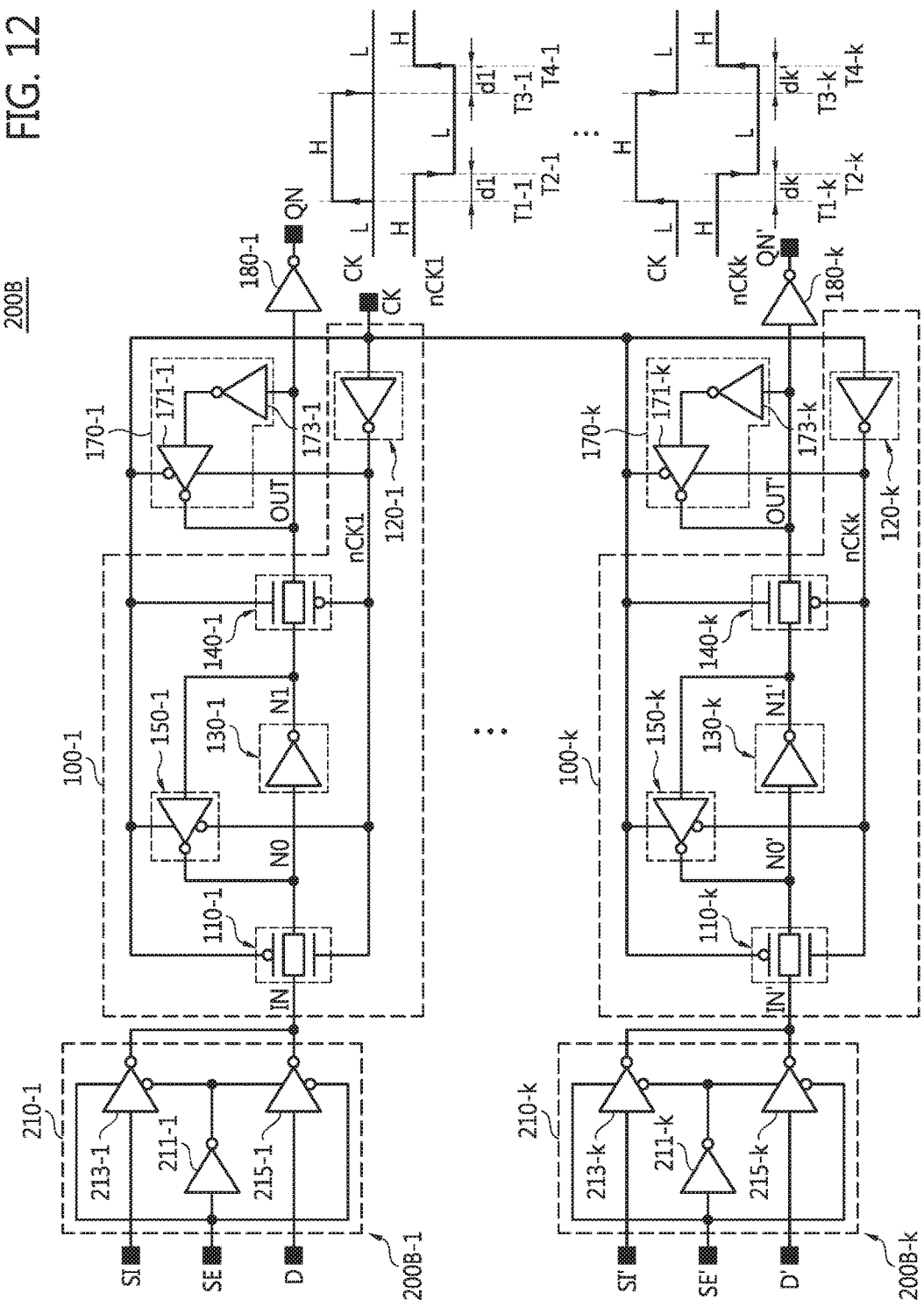

FIG. 12 is a diagram illustrating an integrated circuit 200B including positive edge-triggered, master-slave flip-flop circuits including a selection circuit according to certain embodiments of the inventive concept. Apart from the connection positions of the inverters 180-1 through 180-k, the relevant structure and operation of the integrated circuit 200B are substantially the same as the integrated circuit 200A illustrated in FIG. 11.

With reference to the phase of the data input signal D, the inverter 180-1 may output a final output signal QN having a phase opposite to that of the phase of the data input signal D. With reference to the phase of the data input signal D', the inverter 180-k may output a signal QN' having a phase opposite to the phase of the data input signal D'.

Figure 13:
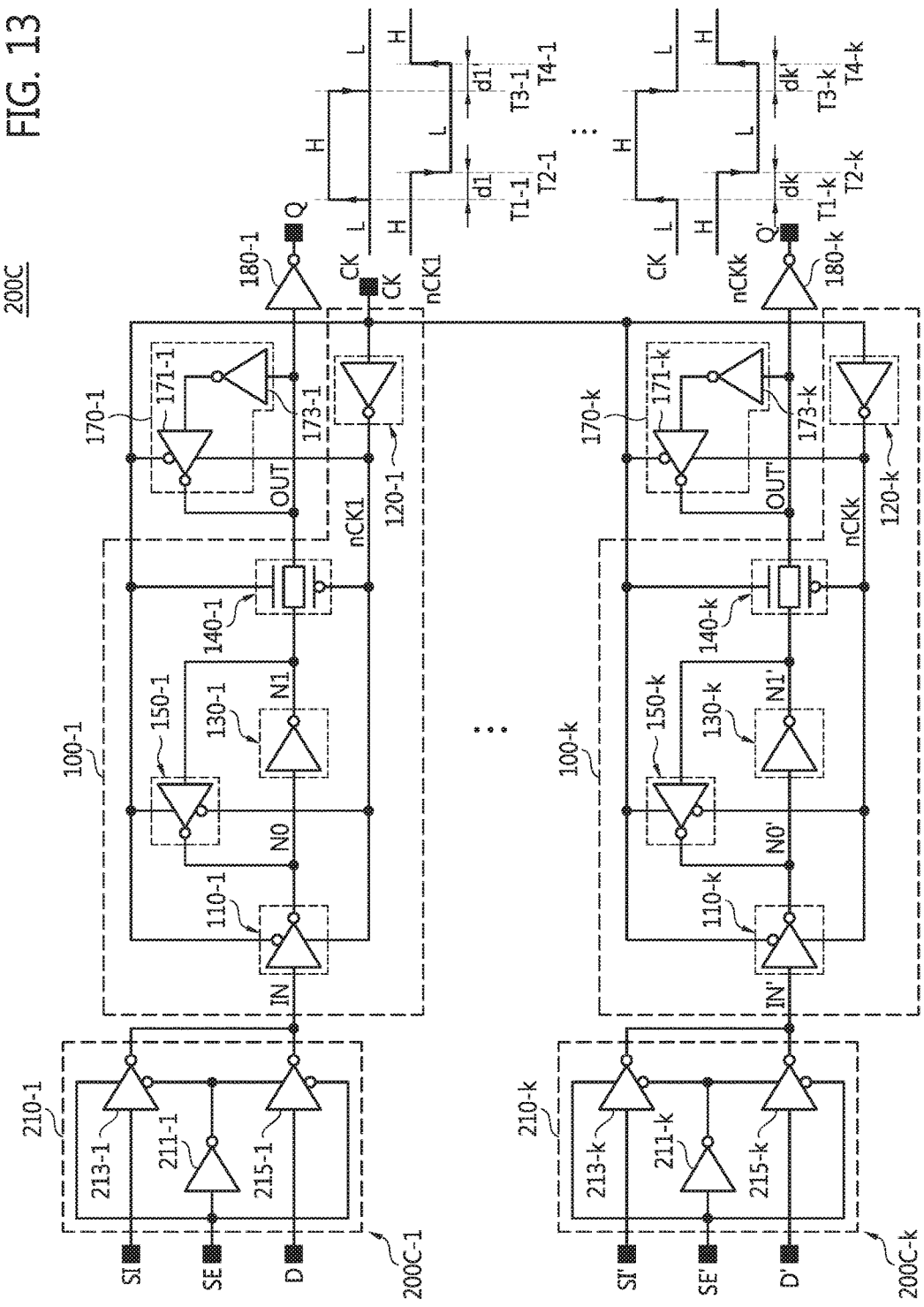

FIG. 13 is a diagram illustrating an integrated circuit 200C including positive edge-triggered, master-slave flip-flop circuits including a selection circuit according to certain embodiments of the inventive concept. Apart from the structure of the input stages 110-1 through 110-k, the relevant structure and operation of the integrated circuit 200C illustrated in FIG. 13 are substantially the same as those of the integrated circuit 200B illustrated in FIG. 12.

With reference to the phase of the data input signal D, the inverter 180-1 may output a signal QN having the same phase as the data input signal D. With reference to the phase of the data input signal D', the inverter 180-k may output a signal QN' having the same phase as the data input signal D'.

Figure 14:
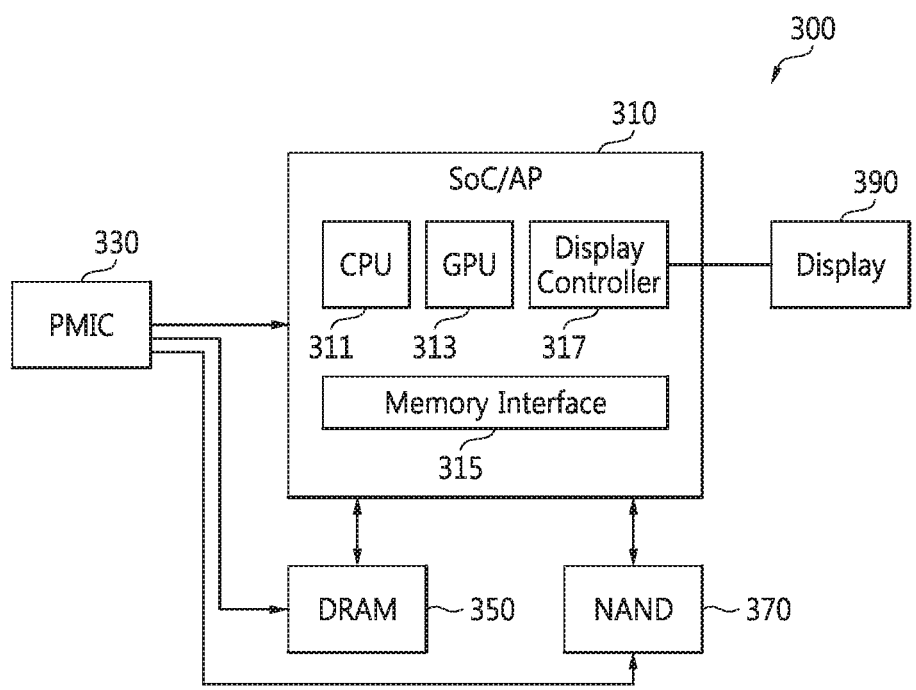
FIG. 14 is a block diagram illustrating a data processing system including a positive edge-triggered master-slave flip-flop circuit according to certain embodiments of the inventive concept.

FIG. 14 is a block diagram illustrating a data processing system 300 including a positive edge-triggered, master-slave flip-flop circuit according to certain embodiments of the inventive concept. The data processing system 300 comprises a controller 310, a power management integrated circuit (PMIC) 330, a first memory device 350, a second memory device 370, and a display 390. The data processing system 300 may be implemented as a personal computer (PC), a data server, a data center, an internet data center (IDC), or a mobile computing device. The mobile computing device may be a laptop computer, a cellular phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, or an e-book.

The controller 310 may control the PMIC 330, the first memory device 350, the second memory device 370, and the display 390. The controller 310 may be implemented as a processor, an integrated circuit (IC), an application processor (AP), or a mobile AP. The controller 310 may include one or more "functional components" 311, 313, 315, and 317, where each of the functional components 311, 313, 315, and 317 may include the positive edge-triggered, master-slave flip-flop circuits 100-1 through 100-k described above.

Here, a functional component may be a circuit capable of storing a data state for a corresponding digital signal using one or more positive edge-triggered, master-slave flip-flop circuits 100-1 through 100-k. A function component may be implemented as a functional block, where a functional block may be implemented as a hardware component, hardware module, electronic circuit, etc.

For example, a functional component may be a central processing unit (CPU) 311, a graphics processing unit (GPU) 313, a core of a multi-core processor, a digital signal processor (DSP), an image signal processor (ISP), a memory interface 315, a display controller 317, a codec, or a multimedia processor. The multimedia processor may include a video processor and/or an audio processor.

The CPU 311 may control the overall operation of the controller 310. The CPU 311 may control the operations of the GPU 313, the memory interface 315, and/or the display controller 317. The GPU 313 may process two or three dimensional graphic data and may transmit processed data to the memory interface 315 and/or the display controller 317.

The memory interface 315 may write data to or read data from the memory devices 350 and 370 according to the control of the CPU 311 or the GPU 313. The memory interface 315 may include an interface for interfacing with the first memory device 350 and an interface for interfacing with the second memory device 370. The PMIC 330 may provide operating voltages for the first memory device 350, the second memory device 370, and/or the display 390.

The first memory device 350 may be implemented with a volatile memory device. The volatile memory device may be implemented with random access memory (RAM) functioning as a buffer or dynamic RAM (DRAM), but the inventive concept is not restricted to these examples. The second memory device 370 may be implemented with a non-volatile memory device. The non-volatile memory device may be implemented with electrically erasable programmable read-only memory (EEPROM), flash memory, magnetic RAM (MRAM), spin-transfer torque MRAM, ferroelectric RAM (FeRAM), phase-change RAM (PRAM), or resistive RAM (RRAM), but the inventive concept is not restricted to these examples.

The second memory device 370 may be a flash-based memory device. The flash-based memory device may be a NAND-type flash memory device or a NOR-type flash memory device. The second memory device 370 may be implemented as a smart card, a secure digital (SD) card, a multimedia card (MMC), an embedded MMC (eMMC), an embedded multi-chip package (eMCP), a perfect page NAND (PPN), a universal flash storage (UFS), a solid state drive (SSD), or an embedded SSD (eSSD).

The display 390 may display data output from the display controller 317 according to the control of the display controller 317.

Figure 15:
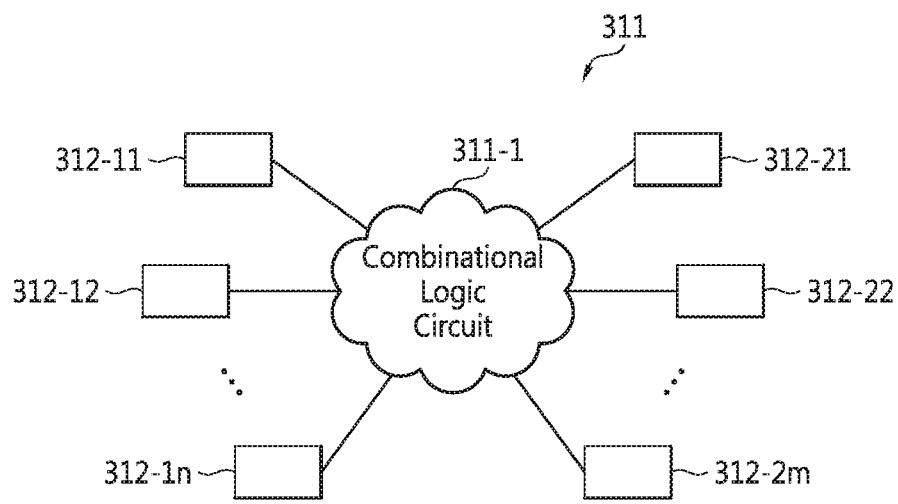
FIG. 15 is a conceptual diagram illustrating an integrated circuit including a positive edge-triggered master-slave flip-flop circuits according to certain embodiments of the inventive concept.

FIG. 15 is a conceptual diagram of an integrated circuit including a positive edge-triggered, master-slave flip-flop circuit according to certain embodiments of the inventive concept. For convenience' sake in the description, the CPU 311 is shown as an example of the integrated circuit in the embodiments illustrated in FIG. 15, but the inventive concept is not restricted to the current embodiments. The integrated circuit may be any one of the function components described above.

The CPU 311 may include a combinational logic circuit 311-1 and flip-flop circuits 312-11 through 312-1*n* and 312-21 through 312-2*m*, where "n" and "m" are natural numbers greater than 1. At least two of the flip-flop circuits 312-11 through 312-1*n* and 312-21 through 312-2*m* may share a clock signal apparent at a clock signal input node.

The combinational logic circuit 311-1 may be a Boolean circuit or a digital logic circuit which can be implemented using Boolean logic. The combinational logic circuit 311-1 may not include a storage element such as a latch or a flip-flop circuit.

At least one of the flip-flop circuits 312-11 through 312-1*n* and 312-21 through 312-2*m* may communicate data with at least another one of the flip-flop circuits 312-11 through 312-1*n* and 312-21 through 312-2*m* through the combinational logic circuit 311-1. For example, an output signal of the flip-flop circuit 312-11 may be provided as an input signal of the flip-flop circuit 312-11 through the combinational logic circuit 311-1.

Each of the flip-flop circuits 312-11 through 312-1*n* and 312-21 through 312-2*m* is implemented to be suitable for a standard cell library. The flip-flop circuits 312-11 through 312-1*n* and 312-21 through 312-2*m* are substantially the same as or similar to the flip-flop circuits 100-1 through 100-*k* described with reference to FIGS. 1A through 13.

FIG. 16 is a flowchart summarizing a method of operation for a positive edge-triggered, master-slave flip-flop circuit according to various embodiments of the inventive concept. The operation of the first flip-flop circuit 100-1 will be described with reference to FIGS. 1A through 16. The flip-flop circuits 100-1 through 100-*k* perform the same operations, and therefore, the operations of the first flip-flop circuit 100-1 will be described representatively.

The first inverting circuit 120-1 may be used to generate the inverted clock signal nCK1 that transitions from high to low at the second time T2-1 following a first time T1-1 by delaying the clock signal CK that transitions from low to high at the first time T1-1 (S110). The clock signal CK is applied to the gate of the NMOS transistor NT1 of the transmission gate 140-1 and the gate of the PMOS transistor PT2 of the input stage 110-1, and the inverted clock signal nCK1 is applied to the gate of the PMOS transistor PT1 of the transmission gate 140-1 and the gate of the NMOS transistor NT2 of the input stage 110-1 (S120).

As described above, according to embodiments of the inventive concept, a positive edge-triggered master-slave flip-flop circuit may be implemented in such a manner that it operates at high speed with relatively low power consumption while occupying a relatively small area.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A system on chip (SoC) comprising:
a first flip-flop circuit including:
a first input circuit configured to receive a first input signal, and to provide a first output signal based on a clock signal;
a first inverting circuit configured to generate a first inverted clock signal based on the clock signal;
a second inverting circuit configured to receive the first output signal, and to generate a second output signal; and
a first transmission gate configured to receive the second output signal, and to generate a third output signal based on the clock signal and the first inverted clock signal; and
a second flip-flop circuit including:
a second input circuit configured to receive a second input signal, and to provide a fourth output signal based on the clock signal;
a third inverting circuit configured to generate a second inverted clock signal based on the clock signal;
a fourth inverting circuit configured to receive the fourth output signal, and to generate a fifth output signal; and
a second transmission gate configured to receive the fifth output signal, and to generate a sixth output signal based on the clock signal and the second inverted clock signal,
wherein the first flip-flop circuit and the second flip-flop circuit share the clock signal, and
wherein the first input signal includes a plurality of input bits,
the first input circuit logically combines input bits selected from the plurality of input bits to generate a logical combination result, inverts at least one of the input bits combined in the logical combination result to generate an inverted signal, and provides the inverted signal to the second inverting circuit as the first output signal.

2. The SoC of claim 1, wherein each of the first input circuit and the second input circuit is implemented using a tri-state inverter.

3. The SoC of claim 1, wherein the first input circuit provides the first output signal based on the first inverted clock signal, and
the second input circuit provides the fourth output signal based on the second inverted clock signal.

4. The SoC of claim 1, wherein the first input circuit provides the first output signal when the clock signal transitions from low to high.

5. The SoC of claim 1, wherein the first inverting circuit generates the first inverting clock signal by delaying the clock signal.

6. The SoC of claim 1, wherein the first and second transmission gates include a PMOS transistor and an NMOS transistor.

7. A system on chip (SoC) comprising:
an input circuit configured to receive an input signal, and to provide a first output signal;

a first inverting circuit configured to generate an inverted clock signal based on a clock signal;

a second inverting circuit configured to receive the first output signal, and to generate a second output signal; and a transmission gate configured to receive the second output signal, and to generate a third output signal based on the clock signal and the inverted clock signal, wherein the input circuit is implemented using a tri-state inverter, and the input circuit is configured to provide the first output signal based on the clock signal and the inverted clock signal, and wherein the input signal includes a plurality of input bits, the input circuit logically combines input bits selected from the plurality of input bits to generate a logical combination result, inverts at least one of the input bits combined in the logical combination result to generate an inverted signal, and provides the inverted signal to the second inverting circuit as the first output signal.

8. The SoC of claim 7, further comprising a keeper circuit configured to operate in response to the clock signal and the inverted clock signal, an input terminal of the keeper circuit is connected to an output terminal of the second inverting circuit, and an output terminal of the keeper circuit is connected to an output terminal of the input circuit.

9. The SoC of claim 7, further comprising a latch configured to latch the third output signal in response to the clock signal and the inverted clock signal.

10. The SoC of claim 7, further comprising a selection circuit configured to selectively provide either one of a scan input signal and a data input signal to the input circuit as the input signal.

11. The SoC of claim 7, wherein the input circuit provides the first output signal when the clock signal transitions from low to high.

12. The SoC of claim 7, wherein the first inverting circuit generates the inverted clock signal by delaying the clock signal when the inverted clock signal transitions from high to low.

13. A system on chip (SoC) comprising a plurality of flip-flop circuits sharing a clock signal, each of the plurality of flip-flop circuits comprising:

an input circuit configured to receive an input signal, and to provide a first output signal;

a first inverting circuit configured to generate an inverted clock signal based on the clock signal; and a second inverting circuit configured to receive the first output signal, and to generate a second output signal, wherein the input circuit is implemented using a tri-state inverter, and the input circuit is configured to provide the first output signal based on the clock signal and the inverted clock signal, and wherein the input signal includes a plurality of input bits, the input circuit logically combines input bits selected from the plurality of input bits to generate a logical combination result, inverts at least one of the input bits combined in the logical combination result to generate an inverted signal, and provides the inverted signal to the second inverting circuit as the first output signal.

14. The SoC of claim 13, wherein each of the plurality of flip-flop circuits further comprising:

a transmission gate configured to receive the second output signal, and to generate a third output signal based on the clock signal and the inverted clock signal;

a latch configured to latch the third output signal in response to the clock signal and the inverted clock signal; and a keeper circuit configured to operate in response to the clock signal and the inverted clock signal, an input terminal of the keeper circuit being connected to an output terminal of the second inverting circuit, an output terminal of the keeper circuit being connected to an output terminal of the input circuit.

15. The SoC of claim 13, wherein each of the plurality of flip-flop circuits is a positive edge-triggered master-slave flip-flop.

16. The SoC of claim 13, wherein the first inverting circuit is implemented as a single logic gate.

* * * * *